United States Patent [19]
Kim et al.

[11] Patent Number: 6,071,868
[45] Date of Patent: Jun. 6, 2000

[54] PHOTORESIST STRIPPING COMPOSITION

[75] Inventors: Jin-Seock Kim, Choongcheongnam-do; Yang-Sun Kim, Kyungki-do; Seog-Young Lim, Kyungki-do; Dong-Uk Choi, Kyungki-do; Koog-Lok Lee, Seoul, all of Rep. of Korea

[73] Assignee: Samsung Electronics Co., Ltd., Suwon, Rep. of Korea

[21] Appl. No.: 09/227,257

[22] Filed: Jan. 8, 1999

[30] Foreign Application Priority Data

Aug. 25, 1998 [KR] Rep. of Korea ............... 98-34456

[51] Int. Cl.[7] .............. G03F 7/42; C23F 1/00; H01L 21/027
[52] U.S. Cl. ............ 510/176; 510/175; 510/435; 510/493; 510/500; 510/506
[58] Field of Search .................. 510/175, 176, 510/201, 405, 435, 506, 493, 500; 430/256

[56] References Cited

U.S. PATENT DOCUMENTS

| | | | |
|---|---|---|---|
| 5,308,527 | 5/1994 | Lallier et al. | 252/162 |
| 5,480,585 | 1/1996 | Shiotsu et al. | 252/544 |
| 5,597,678 | 1/1997 | Honda et al. | 430/331 |
| 5,753,603 | 5/1998 | Lallier et al. | 510/212 |
| 5,795,702 | 8/1998 | Tanabe et al. | 430/331 |
| 5,988,186 | 11/1999 | Ward et al. | 134/1.3 |
| 6,001,192 | 5/1999 | Lallier et al. | 134/38 |

FOREIGN PATENT DOCUMENTS

| | | | |
|---|---|---|---|
| 40124668 | 4/1996 | Japan | H01L 21/30 |
| 8087118 | 4/1996 | Japan | H01L 21/30 |

*Primary Examiner*—Yogendra Gupta
*Assistant Examiner*—Gregory E. Webb
*Attorney, Agent, or Firm*—Howrey Simon Arnold & White, LLP

[57] ABSTRACT

A photoresist stripping composition is provided. The composition includes 10–30 weight % of alkanolamine, 10–35 weight % of dimethylsulfoxide, 30–50 weight % of N-methylpyrrolidone and 10–30 weight % of glycolether. The composition shows good stripping force and strips photoresist by a single-wafer treatment method using the air-knife process or by a dipping method.

6 Claims, 3 Drawing Sheets

PHOTORESIST STRIPPING COMPOSITION

BACKGROUND OF THE INVENTION

(1) Field of the Invention

The present invention relates to a photoresist stripping composition and, more particularly to, a composition having high photoresist dissolving and stripping force.

(2) Description of the Related Art

A semiconductor integrated circuit in a liquid crystal display panel has very fine structures. Such a fine circuit is generally manufactured by uniformly coating a photoresist on an insulating film of an oxide or a conductive metal film of an aluminum (Al) alloy formed on a substrate, exposing and developing the photoresist to form a certain pattern, and etching the metal film or insulating film by using the patterned photoresist as a mask. Then, the remaining photoresist is stripped to finalize the circuit.

U.S. Pat. No. 5,480,585 and Japanese Laid-open Patent Hei. 5-281753 disclose organic strippers comprising alkanolamine of the structural formula $H_{3-n}N((CH_2)mOH)_n$ (where m is 2 or 3, and n is 1, 2 or 3), a sulfone compound or sulfoxide compound and a hydroxy compound of the structural formula $C_6H_{6-n}(OH)_n$ (where n is 1, 2 or 3). Japanese Laid-open Patent Hei 4-124668 discloses a photoresist stripping composition including an 20–90% by weight of organic amine, 0.1–20% by weight of phosphoric ester surfactant, 0.1–20% by weight of 2-butyne-1, 4-diol, and the remainder glycolmonoalkylether and/or aprotic polar solvent.

Japanese Laid-open Patent Hei. 8-87118 discloses a stripping composition comprising 50 to 90% by weight of N-alkylalkanolamine and 10 to 50% by weight of dimethylsulfoxide or N-methyl-2-pyrrolidone. It states that even under hard stripping conditions (for example, at high temperature) the composition including N-alkylalkanolamine and the organic solvents prevents the formation of non-soluble impurities, thus, leaving no residues on the substrate.

Japanese Laid-open Patent Sho. 64-42653 discloses a photoresist stripping composition comprising over 50% by weight of dimethylsulfoxide (more desirably over 70% by weight), 1 to 50% by weight of a solvent selected among diethyleneglycolmonoalkylether, diethyleneglycoldialkylether, γ-butyrolactone and 1,3-dimethyl-2-imidazolidinone, and 0.1–5% by weight of nitrogen-including organic hydroxyl compound such as monoethanolamine. It states that the amount of dimethylsulfoxide less than 50% by weight causes great reduction in stripping force, while the amount of nitrogen-including organic hydroxyl compound solvent over 5% by weight corrodes metal film such as aluminum.

Conventional compositions have been mainly used for a dipping method, where the etched semiconductor integrated circuits or the liquid display panel circuits are immersed or dipped in the stripping compositions to remove the photoresist. Thus, the improvement in the composition are mainly focused on good chemical properties, such as stripping force, non-corrosiveness of metal and safety of humans. However, the conventional stripping compositions are not suitable for a single-wafer treatment method using an air knife process to remove the photoresist. The single-wafer treatment method using an air knife process are more frequently used than the dipping method for stripping the photoresist in fabricating large-size liquid crystal display panel devices, because a relatively small amount of the stripping compositions is required. Therefore, there is a need for a stripping composition suitable for both the single-wafer treatment method and the dipping method.

In addition, the stripping composition should have high stripping force at low and high temperatures, and should not leave photoresist residues or impurities on the substrate. Also, a desirable stripper is one whose total amount and composition ratio should remain intact even when the composition is repeatedly used to remove the photoresist. Depending on the constituents of the composition and the ratio thereof, the stripping composition exhibits greatly different characteristics in their stripping forces, metal corrosion properties, complexities of a rinsing process following the photoresist stripping process, environmental safety, workability and price.

SUMMARY OF THE INVENTION

It is an object of the present invention to provide a photoresist stripping composition having high photoresist dissolving and stripping force. It is also an object of the present invention to maintain the stripping force even when the composition is repeatedly used to remove a photoresist.

It is another object of the present invention to provide a photoresist stripping composition which can prevent the corrosion of the metal and show the same stripping force when applied to various LCD layers.

It is another object of the present invention to provide a photoresist stripping composition whose total amount and composition ratio of each element are held constantly even when the composition is repeatedly used to remove the photoresist.

It is a further object of the present invention to provide a photoresist stripping composition that is suitable for a single-wafer treatment method using the air-knife process and a dipping method.

To achieve the above objects, the present invention provides a photoresist stripping composition comprising 10–30 weight % of alkanolamine, 10–35 weight % of dimethylsulfoxide, 30–50 weight % of N-methylpyrrolidone and 10–30 weight % of glycolether.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, wherein.

DETAILED DESCRIPTION OF THE INVENTION

Figure 1:
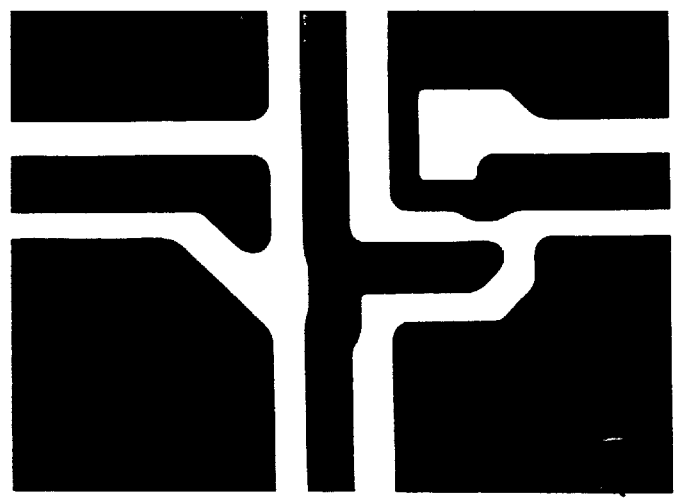
FIG. 1 is a photograph showing a gate pattern formed by stripping a photoresist with a composition according to one embodiment of the present invention.

Generally, a photoresist stripping composition should have a high photoresist dissolving and stripping force, and should maintain a stripping force for various kinds of substrates. In order to be used for both the single-wafer treatment method using an air knife process and the dipping method, the composition should have good chemical properties, such as stripping force, non-corrosiveness of metal and safety of humans, and prevent photoresist residues or impurities from leaving on the substrate. Thus, the photoresist stripping composition should be easily absorbed to the various LCD layers such as ITO (indium tin oxide) layer, aluminum, chrome and silicon-nitride layers, amorphous silicon layer, and should have a low volatility and viscosity, and the surface tension of the composition on the LCD layers should be maintained uniformly and as low as possible. In addition, a contact angle between the LCD layer surface and the composition dropped on the surface should be small, and the contact angle should be maintained constant.

The present invention provides the photoresist stripping composition that meets above-described conditions by increasing the amounts of a polar solvent and an amine compound. The photoresist stripping composition includes 10–30 weight % of alkanolamine, 10–35 weight % of dimethylsulfoxide, 30–50 weight % of N-methylpyrrolidone methylpyrrolidone and 10–30 weight % of glycolether.

The alkanolamine is a compound for stripping the photoresist. The preferable alkanolamine is monoisopropanolamine (MIPA, $CH_3CH(OH)CH_2NH_2$) or monoethanolamine (MEA, $HO(CH_2)_2NH_2$). The prefered alkanolamine is monoethanolamine (MEA, $HO(CH_2)_2NH_2$). The amount of the alkanolamine is preferably 10–30 weight %, and more preferably 15–25 weight % based on the total amount of the stripping composition. If the amount of the alkanolamine is less than 10 weight %, the stripping force of the composition is reduced and the photoresist residue remains on the substrate because the alkanolamine evaporates as the stripping process is repeated. If the amount of the alkanolamine is more than 30 weight %, the absorptiveness of the composition into the LCD layers is reduced, and the contact angle increased. Thus, the composition is not suitable for applying the air-knife process.

The dimethylsulfoxide is a solvent for dissolving the photoresist and controls the surface tension between the surface of the photoresist and the stripping composition. The amount of the dimethylsulfoxide is preferably 10–35 weight %, and more preferably 15–30 weight % based on the total amount of the stripping composition. If the amount of the dimethylsulfoxide is less than 10 weight %, the absorptiveness of the composition into the LCD layers is reduced, and the contact angle increased. Thus, the composition is not suitable for applying the air-knife process. If the amount of the dimethylsulfoxide is more than 35 weight %, the stripping force and the photoresist dissolving power of the composition are reduced. Instead of the dimethylsulfoxide, diethylsulfoxide ($C_2H_5SOC_2H_5$), diethylsulfone ($C_2H_5SO_2C_2H_5$) or dimethylsulfone ($CH_3SO_2CH_3$) can be used, but they are more expensive.

The N-methylpyrrolidone is a strong solvent for dissolving the photoresist. The amount of the N-methylpyrrolidone is preferably 30–50 weight %, and more preferably 35–45 weight % based on the total amount of the stripping composition. If the amount of the N-methylpyrrolidone is less than 30 weight %, the photoresist dissolving power of the composition is overly reduced. If the amount of the N-methylpyrrolidone is more than 50 weight %, the amounts of the alkanolamine or the dimethylsulfoxide should be excessively added to the composition. By using the N-methylpyrrolidone which is a polar molecule and has high photoresist dissolving power, total amount of the polar molecules in the composition increases to prevent the stripping force reduction even when the stripping processes are repeated.

The glycolether is a solvent for dissolving the photoresist like the dimethylsulfoxide and the N-methylpyrrolidone, and also controls the surface tension between the photoresist surface and the stripping composition, making the composition suitable for the air-knife process. More precisely, the dimethylsulfoxide is a suitable solvent for the air-knife process, but when monoethanolamine is mixed with the dimethylsulfoxide, the mixed solution is not suitable for the air-knife method. Therefore, the glycolether is added to the mixed solution to increase the stripping power and the absorptiveness of the mixed solution into the LCD layers, and to reduce the contact angle. As the glycolether, carbitol ($C_2H_5O(CH_2CH_2O)_2H$), methyldiglycol ($CH_3O(CH_2CH_2O)_2H$) or butyldiglycol (BDG, $C_4H_9O(CH_2CH_2O)_2H$) is preferably used, and the more preferable glycolether is butyldiglycol. The amount of the glycolether is preferably 10–30 weight %, and more preferably 15–25 weight % based on the total amount of the stripping composition. If the amount of the glycolether is less than 10 weight %, the absorptiveness of the composition into the LCD layers is reduced, and the contact angle increases. If the amount of the glycolether is more than 30 weight %, the stripping force of the composition is reduced.

The photoresist stripping composition according to the present invention preferably further includes 1–10 weight % of tetramethylammoniumhydroxide or 3–15 weight % of bezenediol to remove impurity polymer on a bare glass or various LCD layers. In addition, the photoresist stripping composition preferably further includes 1–15 weight % of alkylsulfonic acid to prevent the corrosion of the LCD layers.

Some of the preferred embodiment of the present invention are described in detail below.

EXAMPLES 1 AND 2 AND PRIOR ART EXAMPLES 1 AND 2

The photoresist stripping compositions including organic amine compounds and solvents are prepared according to the Table 1. In Table 1, MEA is an organic amine compound and represents monoethanolamine ($HO(CH_2)_2NH_2$), and NMP, DMSO, CARBITOL and BDG respectively represent N-methylpyrrolidone ($C_5H_9NO$), dimethylsulfoxide (DMSO, $CH_3SOCH_3$), carbitol ($C_2H_5O(CH_2CH_2O)_2H$) and butyldiglycol (BDG, ($C_4H_9O(CH_2CH_2O)_2H$), and DI.W represents the deionized water.

TABLE 1

|  | MEA | NMP | DMSO | BDG | CARBITOL | DI.W |
|---|---|---|---|---|---|---|
| Prior Art Example 1 | 10 | 55 | — | — | 35 | — |
| Prior Art Example 2 | 30 | — | 50 | — | — | 20 |
| Example 1 | 15 | 35 | 30 | 20 | — | — |
| Example 2 | 20 | 40 | 20 | 20 | — | — |

As to the compositions of the Examples 1 and 2 and Prior Art Examples 1 and 2, the photoresist dissolving forces, the Al corrosions due to the compositions and its evaporations, photoresist residue formation after stripping a photoresist, and the contact angles are measured.

A). Photoresist Dissolving Forces

A test wafer is prepared by coating a photoresist layer of 1.3 μm on a bare wafer of 3 inches and by sintering the wafer at 170° C. with a hot plate. The wafer is dipped into the photoresist stripping compositions, and the photoresist dissolving speeds are measured and shown in Table 2.

TABLE 2

|  | Prior Art Example 1 | Example 1 | Example 2 |
|---|---|---|---|
| Dissolving speed (Angstrom/sec) | 1930 | 6160 | 6760 |

As shown in Table 2, the photoresist dissolving forces according to the compositions of Examples 1 and 2 are more than three-times stronger than that of Prior Art Example 1.

B). Al Corrosions Due to the Compositions

In order to test the Al corrosions due to the stripping compositions, glasses on which aluminum/chrome gate patterns are formed are immersed into the stripping compositions of Examples 1 and 2 and Prior Art Example 2 at 70° C., and the changes of the gate patterns are observed as shown in Table 3.

TABLE 3

| Immersing time | 30 minutes | 1 hour | 9 hours |
|---|---|---|---|
| Prior Art Example 2 | No change | Little corrosion of Al | Cr is exposed due to the corrosion of Al. |
| Example 1 | No change | No change | No change |
| Example 2 | No change | No change | No change |

As shown in Table 3, the photoresist stripping compositions according to Examples 1 and 2 cause less corrosions of Al than that of the Prior Art Example 2.

C). Evaporations of the Compositions

Glass vials including 40 ml of the photoresist stripping compositions are immersed into an oil-bath of 70° C. The mass reductions of the compositions are measured after 12 and 24 hours, and the reduction rates [(initial weight−final weight)/initial weight×100] are calculated and shown in Table 4.

TABLE 4

|  | Reduction rate (%) | |
|---|---|---|
|  | After 12 hours | After 24 hours |
| Example 1 | 1.50 | 3.15 |
| Example 2 | 1.30 | 3.43 |
| Prior Art Example 2 | 7.00 | 11.95 |

As shown in Table 4, the photoresist stripping composition according to Prior Art Example 2 shows greater reduction rate than those of Examples 1 and 2. Therefore, the composition according to Prior Art Example 2 evaporates more easily during the stripping process, which results in the loss of composition and the formation of harmful gas.

D). Formation of Photoresist Residue After Stripping a Photoresist

Figure 2:
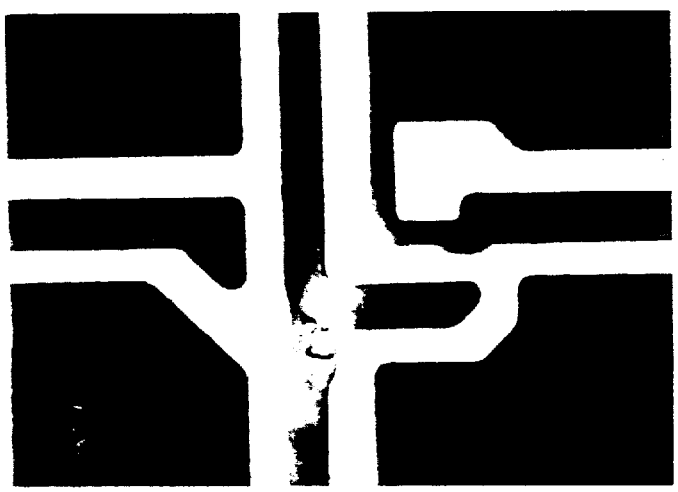
FIG. 2 is a photograph showing a gate pattern formed by stripping a photoresist with a composition according to prior art.

Gate patterns are formed by stripping the photoresist with the compositions according to Prior Art Example 2 and Example 1, and then the formations of photoresist residue are observed. FIG. 1 is a photograph showing the gate pattern formed by stripping the photoresist with the composition according to Example 1, and FIG. 2 is a photograph showing the gate pattern formed by stripping the photoresist with the composition according to Prior Art Example 2. As shown in FIG. 2, when the composition according to Prior Art Example 2 is used, photoresist residues are formed on the aluminum gate line.

E). Measurements of the Contact Angles

Gate and S/D (source/drain) layers are formed on a bare glass, and a photoresist layer of 1300 Angstrom is formed on the layers. Then, 5 μl compositions according to Examples and Prior Art Examples are dropped on the photoresist layer, and 30 photographs of the dropped compositions are obtained with a photographing interval of 1 second. The widths and heights of the dropped compositions on the photoresist layer are measured to calculate the contact angles, and the changes of the calculated contact angles are drawn in FIGS. 3 and 4.

Figure 3:
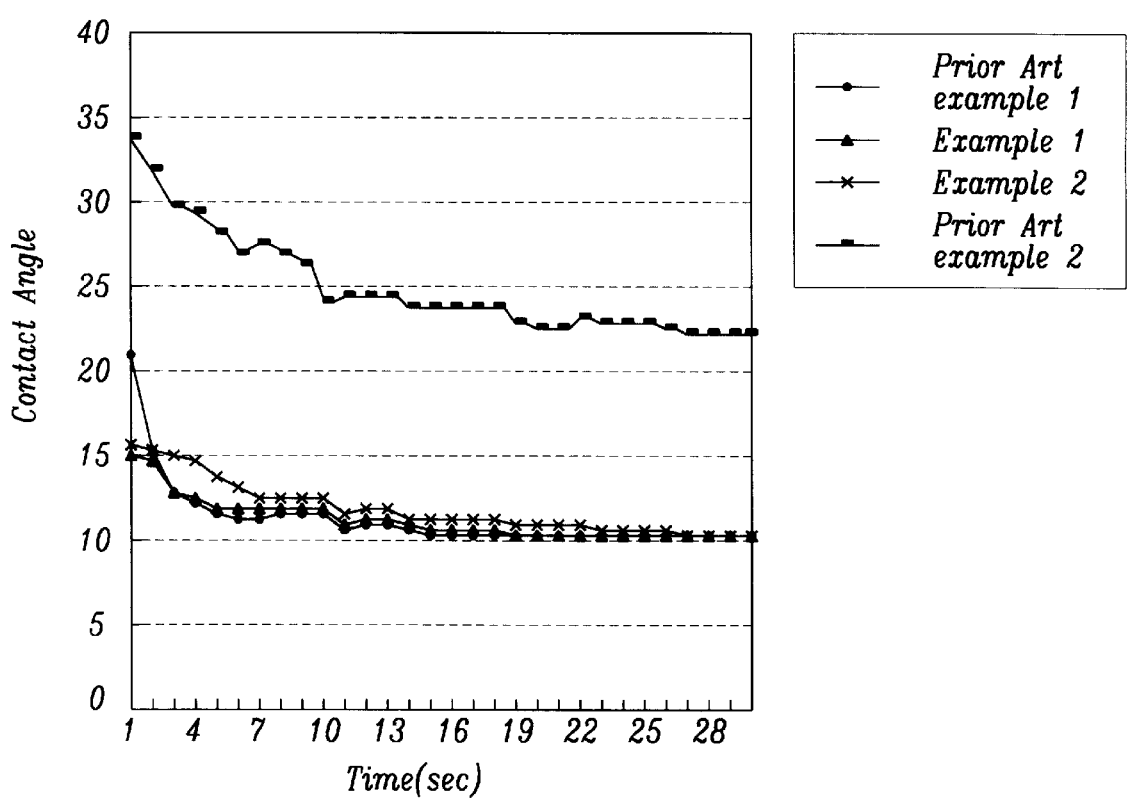
FIG. 3 is a graph showing contact angle changes of photoresist stripping compositions dropped on a photoresist layer formed on a gate layer comparing a composition according to one embodiment of the present invention to a composition according to prior art.
Figure 4:
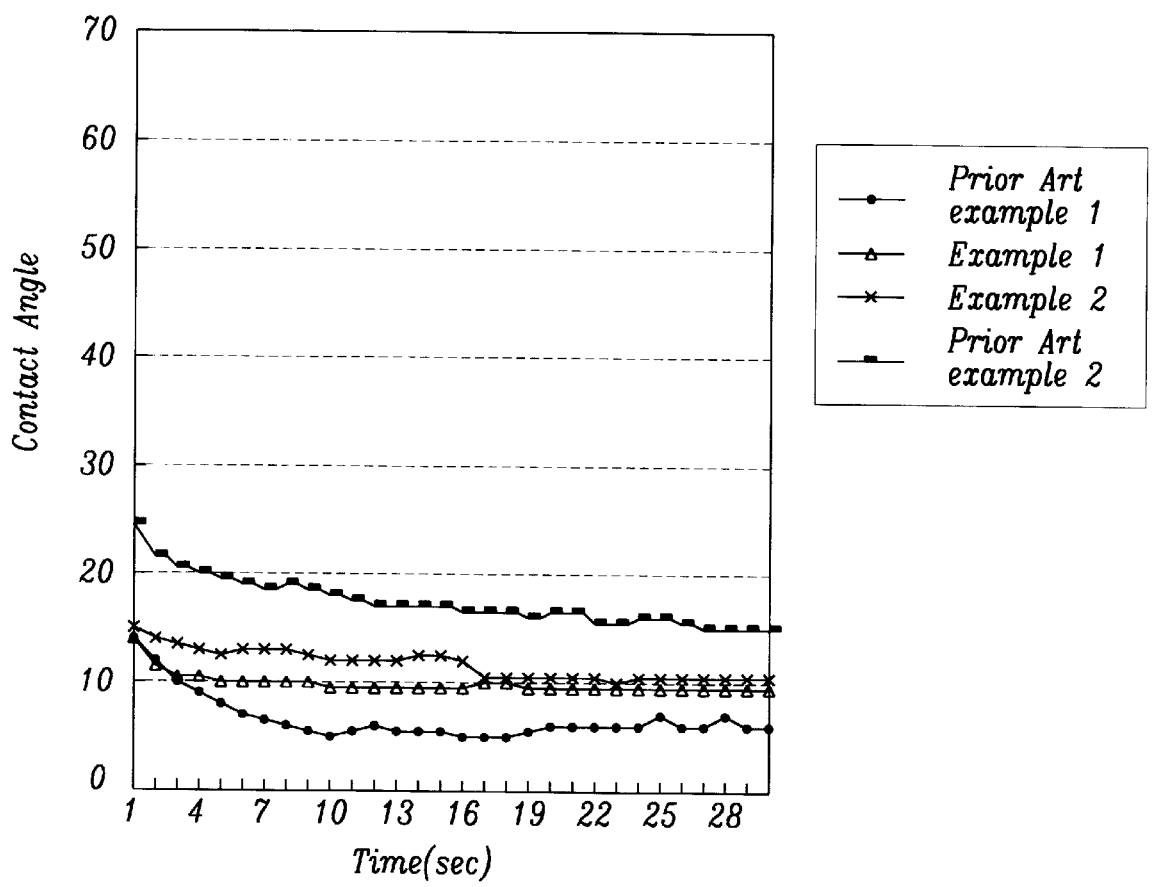
FIG. 4 is a graph showing the contact angle changes of the photoresist stripping compositions dropped on a photoresist layer formed on a S/D layer, comparing a composition according to one embodiment of the present invention to a composition according to prior art.

FIG. 3 is a graph showing the contact angle changes of the compositions dropped on the photoresist layer formed on the gate layer, and FIG. 4 is a graph showing the contact angle changes of the compositions dropped on the photoresist layer formed on the S/D layer. As shown in FIGS. 3 and 4, the photoresist stripping compositions according to the present invention have smaller contact angles and contact angle changes. Thus, the photoresist stripping compositions of the present invention are useful for the single-wafer treatment method using the air-knife process.

In this disclosure, only the preferred embodiments of the invention are shown and described. However, it is to be understood that the invention can be used in various other combinations and environments and can be modified within the scope of the inventive concepts as expressed herein.

What is claimed is:

1. A photoresist stripping composition, comprising:
   10–30 weight % of alkanolamine;
   10–35 weight % of dimethylsulfoxide;
   30–50 weight % of N-methylpyrrolidone; and
   10–30 weight % of glycolether.

2. The photoresist stripping composition according to claim 1, wherein the alkanolamine includes at least one compound selected from the group consisting of monoisopropanolamine and monoethanolamine.

3. The photoresist stripping composition according to claim 1, wherein the glycolether includes at least one compound selected from the group consisting of carbitol, methyidiglycol and butyldiglycol.

4. The photoresist stripping composition according to claim 1, wherein the composition includes 15–25 weight % of alkanolamine, 15–30 weight % of dimethylsulfoxide, 35–45 weight % of N-methylpyrrolidone, and 15–25 weight % of glycolether.

5. The photoresist stripping composition according to claim 4, wherein the alkanolamine is monoethanolamine, and the glycolether is butyldiglycol.

6. The photoresist stripping composition according to claim 1, wherein the composition is used in a single-wafer treatment method using the air-knife process or in a dipping method for stripping a photoresist.

* * * * *